US009696411B2

(12) United States Patent
McGlone

(10) Patent No.: US 9,696,411 B2
(45) Date of Patent: Jul. 4, 2017

(54) SYSTEM AND METHOD FOR MULTI-WAVELENGTH OPTICAL SIGNAL DETECTION

(71) Applicant: The United States of America as represented by the Administrator of the National Aeronautics and Space Administration, Washington, DC (US)

(72) Inventor: Thomas D. McGlone, Williamsburg, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 364 days.

(21) Appl. No.: 14/592,272

(22) Filed: Jan. 8, 2015

(65) Prior Publication Data
US 2015/0214388 A1    Jul. 30, 2015

Related U.S. Application Data

(60) Provisional application No. 61/931,918, filed on Jan. 27, 2014.

(51) Int. Cl.
*H01L 31/02* (2006.01)
*G01S 7/481* (2006.01)
(Continued)

(52) U.S. Cl.
CPC .......... *G01S 7/4816* (2013.01); *G01S 7/4861* (2013.01); *G01S 7/4913* (2013.01);
(Continued)

(58) Field of Classification Search
CPC .... G01S 7/4816; G01S 7/4861; G01S 7/4913; H01L 31/02019; H01L 25/167; H01L 2924/0002
(Continued)

(56) References Cited

U.S. PATENT DOCUMENTS

| | | | | | |
|---|---|---|---|---|---|
| 5,933,453 | A | * | 8/1999 | Lewison | H03K 7/08 332/109 |
| 6,642,754 | B1 | * | 11/2003 | Dobramysl | G06F 7/68 327/105 |
| 6,731,967 | B1 | * | 5/2004 | Turcott | A61B 5/0261 600/407 |

OTHER PUBLICATIONS

David J. Goodman, "The Application of Delta Modulation to Analog-to-PCM Encoding," The Bell System Technical Journal, Feb. 1969, vol. 48, No. 2.
(Continued)

*Primary Examiner* — Seung C Sohn
(74) *Attorney, Agent, or Firm* — Andrea Z. Warmbier

(57) ABSTRACT

The system and method for multi-wavelength optical signal detection enables the detection of optical signal levels significantly below those processed at the discrete circuit level by the use of mixed-signal processing methods implemented with integrated circuit technologies. The present invention is configured to detect and process small signals, which enables the reduction of the optical power required to stimulate detection networks, and lowers the required laser power to make specific measurements. The present invention provides an adaptation of active pixel networks combined with mixed-signal processing methods to provide an integer representation of the received signal as an output. The present invention also provides multi-wavelength laser detection circuits for use in various systems, such as a differential absorption light detection and ranging system.

20 Claims, 5 Drawing Sheets

(51) Int. Cl.
  *H01L 25/16* (2006.01)
  *G01S 7/486* (2006.01)
  *G01S 7/491* (2006.01)

(52) U.S. Cl.
  CPC ...... *H01L 25/167* (2013.01); *H01L 31/02019* (2013.01); *H01L 2924/0002* (2013.01)

(58) Field of Classification Search
  USPC .......................................................... 250/206
  See application file for complete search history.

(56) References Cited

OTHER PUBLICATIONS

Sunetra Menus, et al., "CMOS Active Pixel Image Sensor," IEEE Transactions on Electron Devices, IEEE, Mar. 1994, pp. 452-453, vol, 41, No. 3.
E.R. Fossum, "Active pixel sensors: are CCD's dionsaurs?," Charge-Coupled Devices and Solid-State Optical Sensors III, Proc. SPIE 1900, pp. 1-13, 1993.

* cited by examiner

SYSTEM AND METHOD FOR MULTI-WAVELENGTH OPTICAL SIGNAL DETECTION

CROSS-REFERENCE TO RELATED PATENT APPLICATIONS

This patent application claims the benefit of and priority to U.S. Provisional Patent Application No. 61/931,918, titled "Use of Delta-Sigma Modulation Techniques to Aid In Reducing Laser Power," filed on Jan. 27, 2014, the entire contents of which are hereby incorporated by reference in their entirety.

STATEMENT REGARDING FEDERALLY SPONSORED RESEARCH OR DEVELOPMENT

The invention described herein was made by an employee of the United States Government and may be manufactured and used by or for the Government of the United States of America for governmental purposes without the payment of any royalties thereon or therefore.

BACKGROUND OF THE INVENTION

Discrete circuits have been used in conventional laser-based measurement systems because the discrete circuit components are simple and inexpensive. However, the parasitic effects related to physical size, configuration, and interconnections of the components of the discrete circuits make it difficult to detect and process very small signals. To overcome these deficiencies, laser-based measurement systems have relied on increased laser power, increasingly larger arrays of photodiodes, and computing resource intensive signal processing methods.

Photodiodes have been used to convert optical signals (in the form of a photon flux) to an electrical signal in the form of a charge flux (current) in conventional laser-based measurement systems. These photodiode currents are often in the picoamp (pA) range, and signals of such low magnitude are difficult to detect and process with conventional discrete circuit techniques. Integrated circuit technologies allow for the use of component values that are smaller than discrete circuit values, and also allow the use of signal processing methods that are difficult or impossible to implement using discrete level components.

While there has been integrated circuit development work applied to increasingly larger arrays for imaging applications with some digital imaging products exceeding 40 million pixels per sensor, the design methods used for large imaging array integrated circuits introduce many of the same problems associated with discrete level implementations due to the required interconnection of parts.

Accordingly, there is a need for a laser-based measurement system with a unified network dedicated to the use of a single detector or small number of detectors.

BRIEF SUMMARY OF THE INVENTION

The systems, methods, and devices of the present invention may enable the detection of optical signal levels significantly below those processed at the discrete circuit level by the use of mixed-signal processing methods implemented with integrated circuit technologies. The various embodiments' ability to detect and process small signals may enable the reduction of the optical power required to stimulate detection networks, which may lower the required laser power to make specific measurements. The various embodiments may provide an adaptation of active pixel networks combined with mixed-signal processing methods providing an integer representation of the received signal as an output. The various embodiments may provide multi-wavelength laser detection circuits for use in various systems, such as a differential absorption light detection and ranging (LIDAR) system (also referred to as a "DIAL" system).

These and other features, advantages, and objects of the present invention will be further understood and appreciated by those skilled in the art by reference to the following specification, claims, and appended drawings.

DETAILED DESCRIPTION OF THE INVENTION

Figure 1:
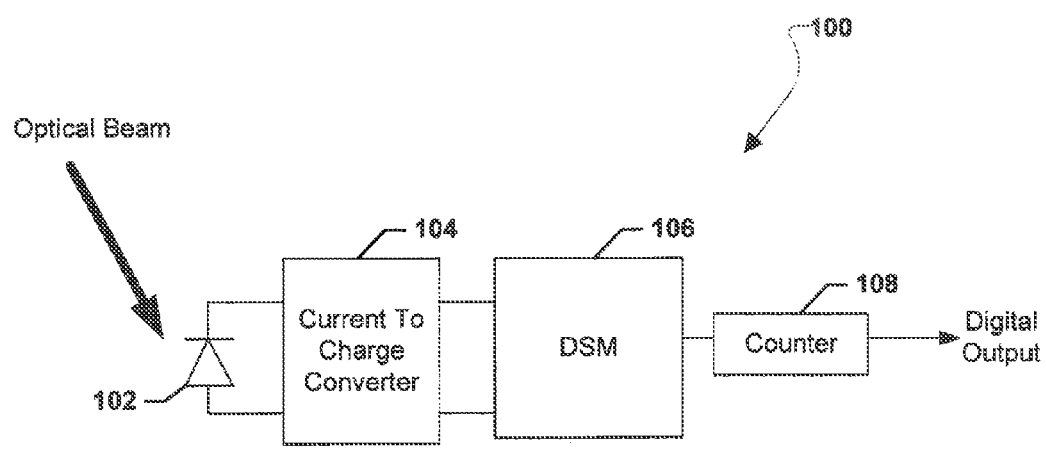
FIG. 1 is block diagram of an electronic component configured to detect and digitize very weak optical signals.

For purposes of description herein, it is to be understood that the specific devices and processes illustrated in the attached drawings, and described in the following specification, are simply exemplary embodiments of the inventive concepts defined in the appended claims. The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The systems, methods, and devices of the various embodiments of the present invention enable the detection of optical signal levels significantly below those processed at the discrete circuit level by the use of mixed-signal processing methods implemented with integrated circuit technologies. The ability to detect and process small signals enables the reduction of the optical power required to stimulate detection networks, which may lower the required laser power to make specific measurements. The various embodiments of the present invention provide an adaptation of active pixel networks combined with mixed-signal processing methods, which provides an integer representation of the received signal as an output.

The various embodiments of the present invention provide a single electronic component configured to detect and digitize very weak optical signals. Additionally, the various embodiments may minimize the complexity of software required for data acquisition and processing of an optical signal. In one embodiment of the present invention, no internal programming may be required for the component. Rather, clock frequency and integration timing for the component may be externally controlled.

The various embodiments may provide a dedicated "system-on-chip" electronic component intended for single or small pixel count with very weak optical signal detection requiring a minimum of control software and a minimization of data storage. The various embodiments may reduce required laser power for a given range and/or increase detection range for given laser power. The various embodiments may enable the reduction in physical size of laser detection systems and the reduction of the supply power required for laser detection systems. The various embodiments may enable the reduction of software required for measurement control and/or signal processing. The various embodiments may enable the reduction of data storage requirements in laser detection systems. Additionally, per unit production costs of the various embodiments may be low.

Research is currently being focused on amplifying returns from imaging arrays, cameras, radar systems, and automatic car systems using camera imaging, in an attempt to increase signal levels from these systems. Rather than increasing the amplification of signals, the various embodiments may optimize detection of a very weak signal by a single, or dual, photo detectors without necessarily amplifying the signal significantly.

The various embodiments may provide multi-wavelength laser detection circuits for use in various systems, such as a differential absorption light detection and ranging (LIDAR) system (also referred to as a "DIAL" system). The various embodiment electronic components may enable multi-wavelength optical signals to be simultaneously received and processed before digitization of the signals. In an embodiment, an integrated circuit may include one or more photodiodes, such as one photodiode, two photodiodes, three photodiodes, four photodiodes, or more than four photodiodes, and the integrated circuit may include signal channels for each photodiode. In an embodiment, the multiple photodiodes may be "bump-bonded" to a silicon die including the electronic networks to form the integrated circuit. The electronic networks may be suitable for making correlated multi-channel optical measurements and providing a digitized output representing a ratio of the received signals of the multiple photodiodes. "Bump-bonding" may allow the photodiodes different materials to be utilized, and may enable the different material photodiodes to be processed by common electronic networks, thereby improving the reliability of the electronic representation of the measured optical signal.

As shown in FIG. 1, an electronic component 100 may be configured to detect and digitize very weak optical signals (e.g. on the order of picowatt to nanowatt), and detect and process multi-wavelength optical signals. The electronic component 100 includes, a current-to-charge converter (for example an active pixel 104); a delta-sigma modulator (DSM) 106; and a pulse counter 108. Clocking and power inputs may also be provided to the electronic component 100. Operation of the electronic component 100 may be substantially self-contained, with power provided to the electronic component 100 to turn the component on and off. In one embodiment, an accurate clock signal may be provided to the electronic component 100 from an external source, such as a processor. In another embodiment, the electronic component 100 may include a timing element. During operation, the hardware of the electronic component 100 may define an integration start and stop signal to define an output signal sequence length, and control the flow of output information. In one embodiment, the electronic component 100 does not include memory nor embedded software, which is beneficial in that the present invention does not require software development or infrastructure of data storage. The electronic component 100 may be optionally implemented on a complementary metal-oxide-semiconductor (CMOS)/bipolar CMOS (biCMOS) integrated circuit.

The hardware elements of the electronic component 100 may also be configured to operate on a selected time base, with a signal length. and sequencing based at least in part on the selected time base. The electronic component 100 may output the digital data to an external data storage location and/or processor.

In an embodiment, optical flux (intensity) coming into a photodiode 102 may create charge flux (current) output from the photodiode 102. As an example, the photodiode 102 may be a device having responsivity in the 1550 nm wavelength of approximately 1 amp/watt and a typical dark current of 80 pA. In an embodiment, one photodiode 102 may be connected to the active pixel 104. In another embodiment, two photodiodes 102 may be connected to the active pixel 104.

The charge flux may be accumulated on a capacitor of the active pixel element 104 for a defined period of time creating a voltage proportional to the charge accumulated. In this manner, the capacitor of the active pixel element 104 may operate as a current-to-charge converter.

The active pixel 104 may be connected to the DSM 106. In an embodiment, the voltage from the capacitor may be applied to the DSM 106. The DSM 106 may be a feedback element that maintains a quasi-static charge balance on a summing capacitor over some period of time referred to as a "window." This window may include a quantity N clock periods. The summing capacitor may be configured such that charge is continuously subtracted, thereby causing the capacitance voltage to decrease, When the capacitor voltage decreases to a defined reference level, the DSM 106 may cause an incremental quantity of charge at clocked intervals to be added to the capacitor which may incrementally increase the capacitor voltage. When sufficient quantities of charge have been added, the capacitor voltage may rise above the reference and the DSM 106 may stop adding charge. This process may be repeated as necessary such that the quantity of charge subtracted from the capacitor may be equal to the charge added. The DSM 106 output may be a pulse for each increment of charge added. The DSM 106 may also convert the applied voltage from the active pixel element operating as a current-to-charge converter to charge which is also added to the summing capacitor. If the signal is small, the DSM 106 may be forced to supply all of the balancing charge and the output pulse density may be high. If the signal is large, the DSM 106 may not add as much charge to maintain charge balance and the output pulse density may be low. The pulse density may be proportional to the incoming signal, which itself may be proportional to the incoming optical intensity. The number of pulses within the window may be M such that the signal information may the ratio M/N.

In an embodiment, the DMS 106 may be connected to the pulse counter 108 and the output of the DSM 106 may be sent to the counter 108. The signal information may be included within the average pulse density over the length of time defined by the window. The system output may an integer number for every window period. If the window period is defined outside the proposed system, the only information required of the system may be a sequence of integers representing count M for every window having length N. The format of the data may be arbitrary, such as a straight binary output of window length N bits.

In an embodiment, the electronic component 100 may be packaged in a single 28-pin standard SOIC electronic package. The electronic component 100 may operate with a DC voltage supply of 3.3V and a supply current of approximately 4 mA. The unpackaged, unpadded circuit may have an area of 500×300 um, while the padded die may be pad-limited and on the order of 1100×1000 um. Input current ranges may be from 1 nA to 30 DA (approximately 30 dB range). The output of the electronic component 100 may be an encoded binary output, such as an uncoded 13-bit binary signal, that may be fractionally proportional to a normalized full-scale value of 1. In an embodiment, the electronic component 100 may be a sensor of a multi-wavelength laser detection system, such as a DIAL.

Figure 2:
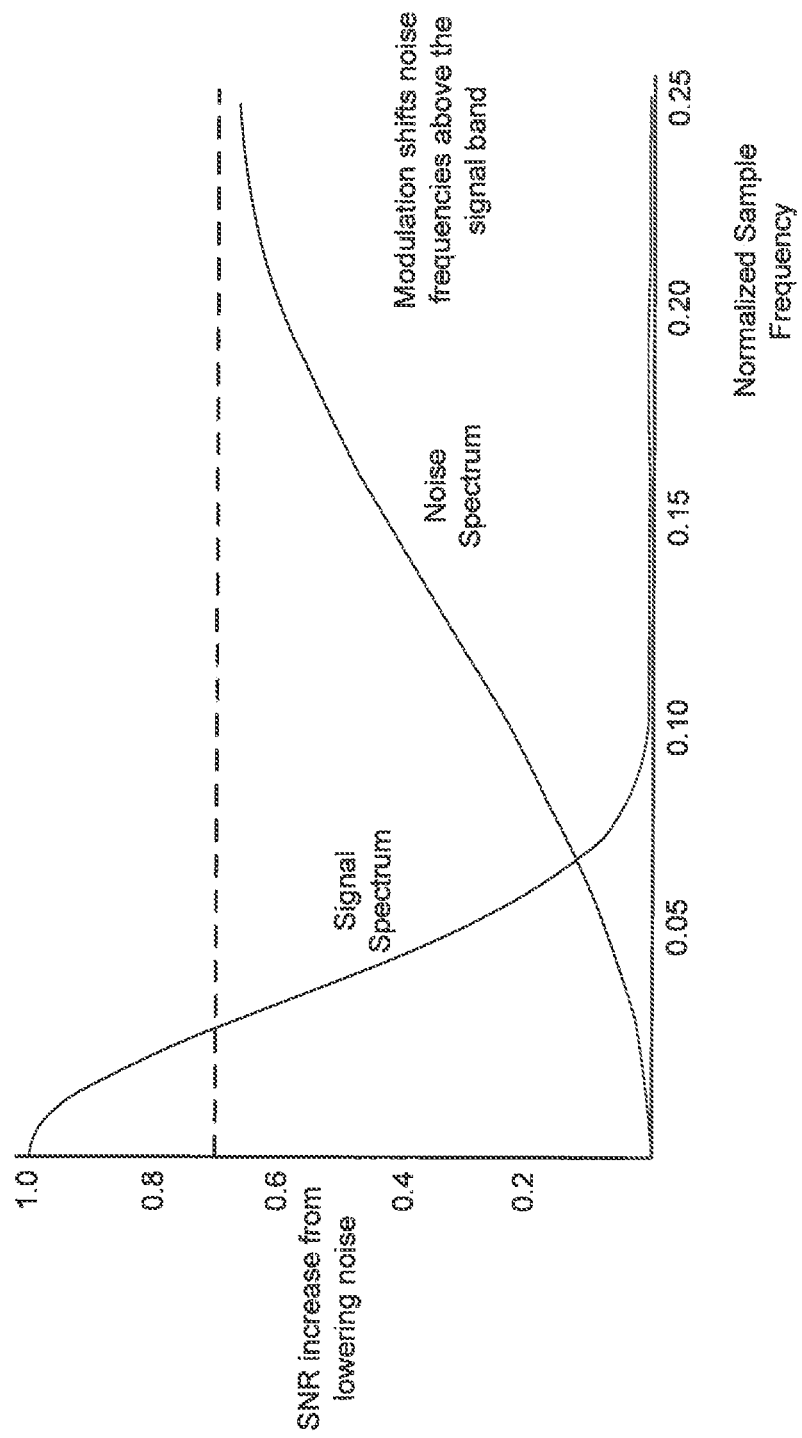
FIG. 2 is a representative graph of a signal and modulated noise according to an embodiment of the present invention.

FIG. 2 is a graph of a signal and modulated noise according to an embodiment. The various embodiments may change the signal and noise separation as illustrated in FIG. 2 to increase the ability to detect the signal in a noisy environment. The various embodiments may frequency shift the noise to a frequency band outside of the signal band.

Figure 3:
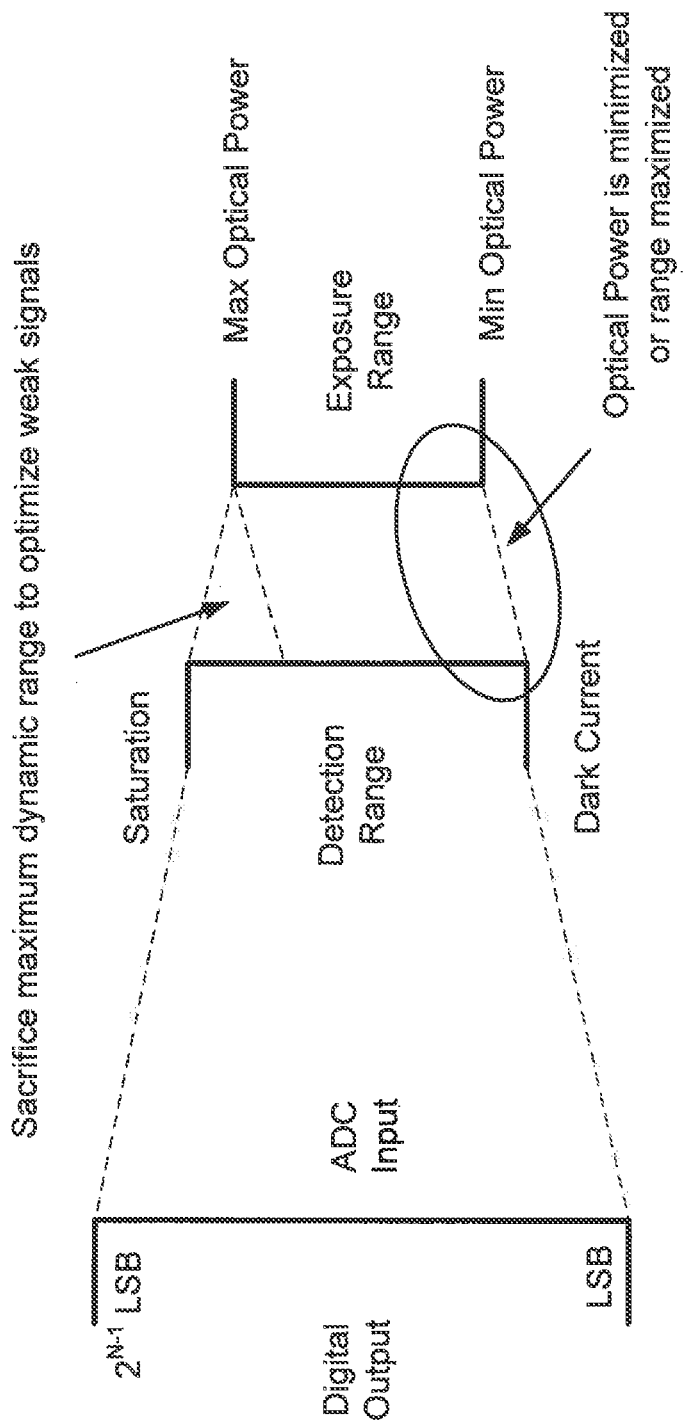
FIG. 3 is a graph of the relative operating ranges of a laser, photodiode, and delta-sigma modulator according to an embodiment of the present invention.

FIG. 3 is a graph of the relative operating ranges of a laser, photodiode, and delta-sigma modulator according to an embodiment.

The various embodiments may be applicable to any photodiode-based detection system attempting to detect very weak optical signals. On example implementation of various embodiments may be in oil pipeline leak detection. A laser beam may be shot down a pipe line, and when tuned properly, the various embodiment electronic components may detect a specific gas absorbed by the laser. Another example implementation of various embodiments may be in laser communications with a very weak laser. Lasers equivalent to a laser pointer power output may be used with the various embodiments, and the electronic components of the various embodiments may be reduced to under the 20 nanometer scale or smaller, enabling the electronic components to be placed in small spaces. The various embodiments may be applicable to low current based signal processing. The various embodiments may operate as current-input (rather than voltage input) analog-to-digital converters and may be applicable to a wide variety of sensor interface applications. The various embodiments may also be applicable to multi-wavelength laser detection, for example by operating multi-wavelength optical signal detection circuits for DIAL systems. The present invention is also applicable in the field of atmospheric science applications, including laser-absorption equipment used to detect various gases (e.g. carbon dioxide, oxygen, etc.).

Figure 4:
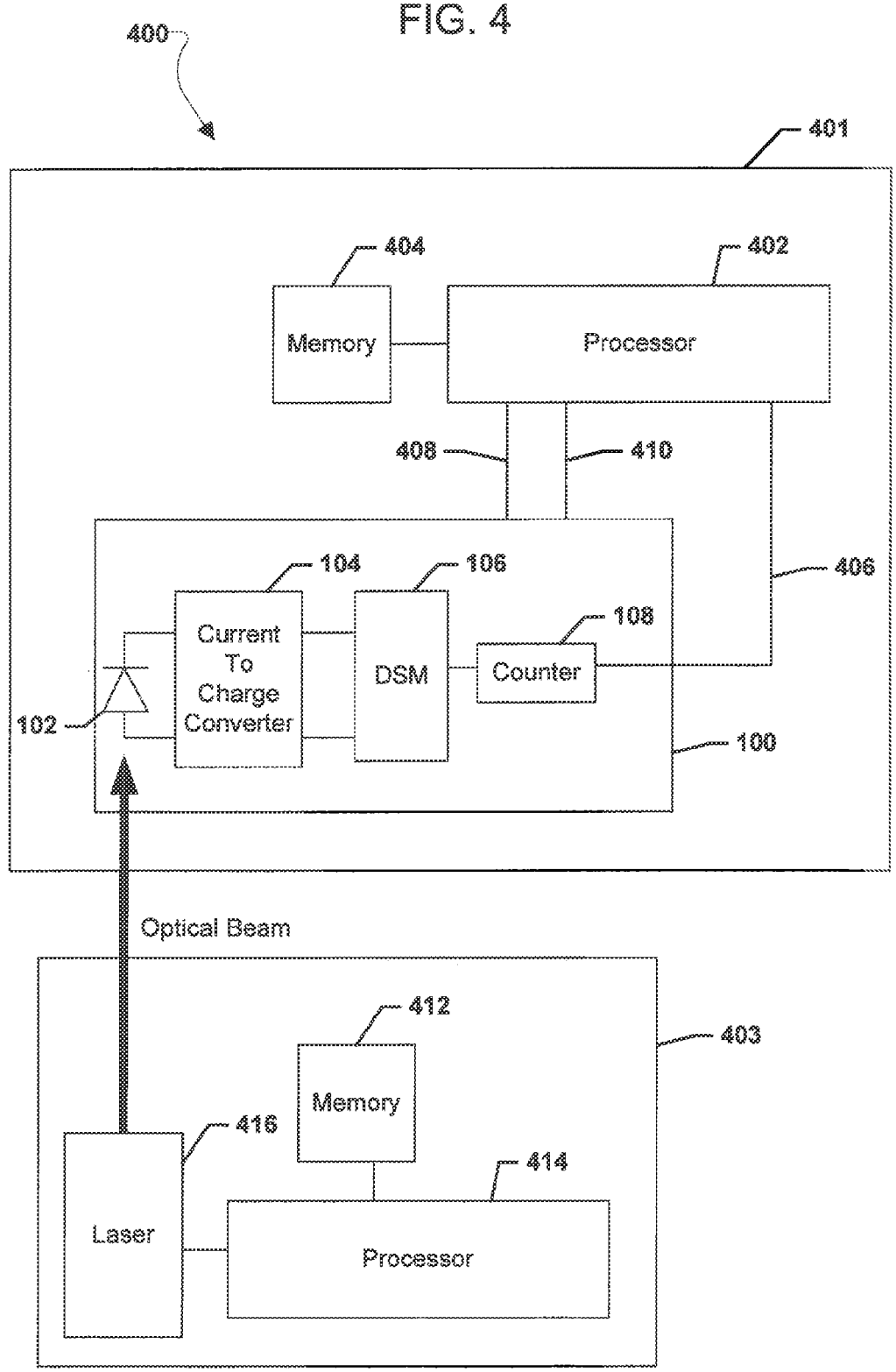
FIG. 4 is a system block diagram of an embodiment of an electronic component included in an optical detection system of the present invention.

FIG. 4 is a system block diagram of an embodiment electronic component 100 included in an optical detection system 400, such as a DIAL. The optical detection system 400 may include an optical transmitter 403, such as a transmitter 403 including a laser 416, and an optical receiver 401 including the electronic component 100 described above with reference to FIG. 1. The optical receiver 401 may include the electronic component 100 which may be connected to a processor 402 connected to a memory 404. The processor 402 may provide a clock input 408 and power input 410 to the electronic component 100 and may receive a digital output 406 from the electronic component 100. The laser 416 of the optical transmitter 403 may be connected to a processor 414 connected to a memory 412. The laser 416 may output a multi-wavelength laser.

In operation, the processor 414 may control the laser 416 to output an optical beam (i.e., an optical signal), such as a multi-wavelength optical signal (e.g., a multi-wavelength laser) that is incident on the photodiode 102 of the electronic component 100. As described above, the charge flux of the photodiode 102 may be converted by the active pixel 104, DSM 106, and counter 108 into a digital output 406 sent to the processor 402 by the electronic component. The processor 402 may use the digital output 406 to generate a digital representation of the received optical beam and may perform further signal processing using the digital output 406.

The processors 402 and 414 may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory before they are accessed and loaded into the processors 402 and 414. The processors 402 and 414 may include internal memory sufficient to store the application software instructions. In many devices the internal memory may be a volatile or nonvolatile memory, such as flash memory, or A mixture of both. For the purposes of this description, a general reference to memory refers to memory accessible by the processors 402 and 414 including internal memory or removable memory plugged into the device and memory within the processors 402 and 414 themselves.

Figure 5A:
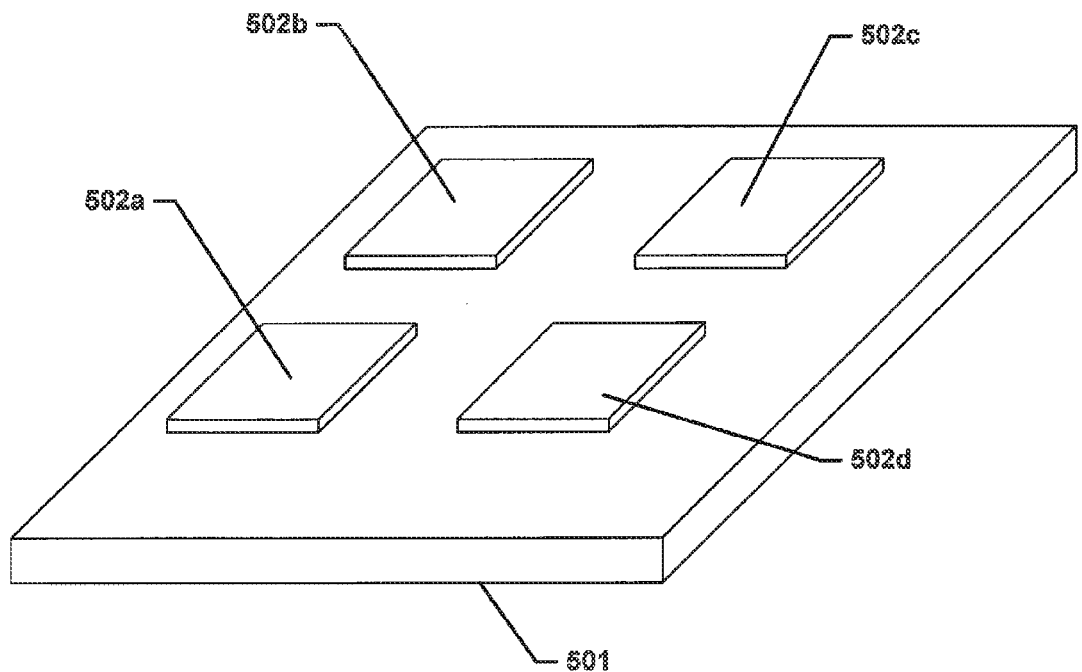
FIGS. 5A and 5B are partial views of an integrated circuit according to an embodiment of the present invention.
Figure 5B:
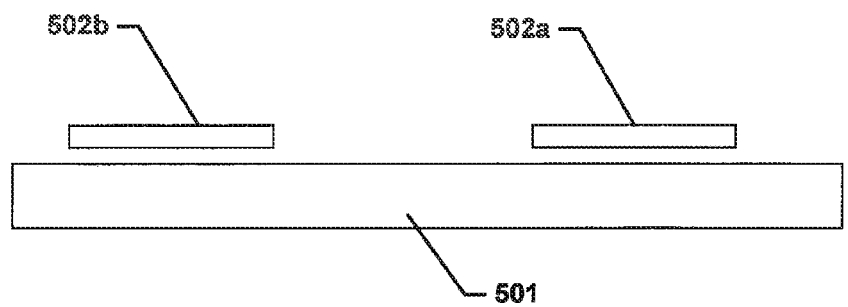

FIGS. 5A and 5B are partial views of a physical configuration of an integrated circuit 501 according to an embodiment of the present invention. FIG. 5A illustrates a perspective view of the integrated circuit 501 including multiple photodiodes 502a, 502b, 502c, and/or 502d. The integrated circuit 501 may include signal channels for each photodiode 502a, 502b, 502c, and/or 502d. FIG. 5B illustrates a side view of the integrated circuit 501. In an embodiment, the multiple photodiodes 502a, 502b, 502c, and/or 502d may be "bump-bonded" to a silicon die including the electronic networks to form the integrated circuit 501. The electronic networks may be suitable for making correlated multi-channel optical measurements and providing a digitized output representing a ratio of the received signals of the multiple photodiodes 502a, 502b, 502c, and/or 502d. "Bump-bonding" may allow photodiodes 502a, 502b, 502c, and/or 502d to be of different materials, and may enable the different material photodiodes 502a, 502b, 502c, and/or 502d to be processed by common electronic networks, thereby improving the reliability of the electronic representation of the measured light.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A multi-wavelength optical signal detector, comprising:
   photodiode configured to output charge flux in response to a multi-wavelength optical signal incident on the photodiode;
   a current-to-charge converter connected to the photodiode and configured to receive the charge flux from the photodiode and output a first voltage proportional to a charge accumulated;
   a delta-sigma modulator (DSM) connected to the current-to-charge converter and configured to receive the first voltage from the current-to-charge converter and output pulses based at least in part on the first voltage; and
   a pulse counter connected to the DSM and configured to receive the pulses from the DSM and output a digital signal based at least in part on the pulses.

2. The multi-wavelength optical signal detector of claim 1, wherein the DSM maintains a quasi-static charge balance on a summing capacitor over a window including a quantity of N clock periods.

3. The multi-wavelength optical signal detector of claim 2, wherein a number of the pulses within the window is M and a signal information of the output digital signal is M/N.

4. The multi-wavelength optical signal detector of claim 3, wherein the output digital signal is an encoded binary signal.

5. The multi-wavelength optical signal detector of claim 4, wherein an unpadded area of the multi-wavelength optical signal detector is 500×300 micrometers (um).

6. The multi-wavelength optical signal detector of claim 5, wherein the multi-wavelength optical signal is a laser.

7. A multi-wavelength optical signal detection system, comprising:
   an optical receiver, comprising:
      an electronic component, comprising:
         a photodiode configured to output charge flux in response to a multi-wavelength optical signal incident on the photodiode;
         a current-to-charge converter connected to the photodiode and configured to receive the charge flux from the photodiode and output a first voltage proportional to a charge accumulated;
         a delta-sigma modulator (DSM) connected to the current-to-charge converter and configured to receive the first voltage from the current-to-charge converter and output pulses based at least in part on the first voltage; and
         a pulse counter connected to the DSM and configured to receive the pulses from the DSM and output a digital signal based at least in part on the pulses; and
      a processor connected to the electronic component and configured to receive the digital signal from the pulse counter; and
   an optical transmitter, comprising a laser configured to output the multi-wavelength optical signal.

8. The multi-wavelength optical signal detection system of claim 7, wherein the DSM maintains a quasi-static charge balance on a summing capacitor over a window including a quantity of N clock periods.

9. The multi-wavelength optical signal detection system of claim 8, wherein a number of the pulses within the window is M and a signal information of the output digital signal is M/N.

10. The multi-wavelength optical signal detection system of claim 9, wherein the output digital signal is an uncoded binary signal.

11. The multi-wavelength optical signal detection system of claim 10, wherein an unpadded area of the electronic component is 500×300 micrometers (um).

12. The multi-wavelength optical signal detection system of claim 11, wherein the multi-wavelength optical signal detection system is a differential absorption light detection and ranging system.

13. The multi-wavelength optical signal detection system of claim 12, wherein the photodiode comprises four photodiodes bump bonded to a silicon die including a signal channel for each of the four photodiodes.

14. The multi-wavelength optical signal detection system of claim 13, wherein the four photodiodes are made of different materials.

15. A method for multi-wavelength optical signal detection, comprising:
receiving a multi-wavelength optical signal at a photodiode;
outputting charge flux from the photodiode to a current-to-charge convener in response to the multi-wavelength optical signal incident on the photodiode;
receiving the charge flux from the photodiode at a current-to-charge converter and outputting a first voltage proportional to a charge accumulated from the current-to-charge converter to a delta-sigma modulator (DSM);
receiving the first voltage from the current-to-charge converter at the DSM and outputting pulses based at least in part on the first voltage from the DSM to a pulse counter; and
receiving the pulses from the DSM at the pulse counter and outputting a digital signal based at least in part on the pulses.

16. The method of claim 15, wherein the DSM Maintains a quasi-static charge balance on a summing capacitor over a window including a quantity of N clock periods.

17. The method of claim 16, wherein a number of the pulses within the window is M and a signal information of the output digital signal is M/N.

18. The method of claim 17, wherein the output digital signal is an uncoded binary signal.

19. The method of claim 17, wherein the multi-wavelength optical signal is a laser.

20. The method of claim 19, wherein:
the photodiode comprises four photodiodes bump bonded to a silicon die including a signal channel for each of the four photodiodes; and
the four photodiodes are made of different materials.

* * * * *